(12) United States Patent
Masuda (10) Patent No.: US 11,518,165 B2
(45) Date of Patent: Dec. 6, 2022

(54) ACTUATOR, LIQUID DISCHARGE HEAD, LIQUID DISCHARGE APPARATUS, AND METHOD OF MANUFACTURING ACTUATOR

(71) Applicant: Ricoh Company, Ltd., Tokyo (JP)

(72) Inventor: Toshiaki Masuda, Kanagawa (JP)

(73) Assignee: RICOH COMPANY, LTD., Tokyo (JP)

( * ) Notice: Subject to any disclaimer, the term of this patent is extended or adjusted under 35 U.S.C. 154(b) by 0 days.

(21) Appl. No.: 17/174,385

(22) Filed: Feb. 12, 2021

(65) Prior Publication Data
US 2021/0252862 A1  Aug. 19, 2021

(30) Foreign Application Priority Data

Feb. 17, 2020  (JP) ............................. JP2020-024267

(51) Int. Cl.
| | | |
|---|---|---|
| B41J 2/14 | (2006.01) | |
| B41J 2/16 | (2006.01) | |
| H01L 41/318 | (2013.01) | |
| H01L 41/09 | (2006.01) | |
| H01L 41/187 | (2006.01) | |

(52) U.S. Cl.
CPC ......... *B41J 2/14201* (2013.01); *B41J 2/1607* (2013.01); *B41J 2/1628* (2013.01); *B41J 2/1642* (2013.01); *B41J 2/1646* (2013.01); *H01L 41/0973* (2013.01); *H01L 41/1876* (2013.01); *H01L 41/318* (2013.01)

(58) Field of Classification Search
None
See application file for complete search history.

(56) References Cited

U.S. PATENT DOCUMENTS

| | | | |
|---|---|---|---|
| 2014/0265734 A1* | 9/2014 | Fox | ....................... H01L 41/318 310/357 |
| 2014/0267509 A1 | 9/2014 | Shinkai et al. | |
| 2015/0022592 A1 | 1/2015 | Aoyama et al. | |
| 2015/0070444 A1* | 3/2015 | Ishimori | .............. B41J 2/14233 347/68 |
| 2015/0171307 A1 | 6/2015 | Masuda et al. | |
| 2016/0001556 A1 | 1/2016 | Masuda et al. | |
| 2017/0100934 A1 | 4/2017 | Masuda et al. | |
| 2017/0253040 A1 | 9/2017 | Shinkai et al. | |
| 2018/0370237 A1 | 12/2018 | Mizukami et al. | |
| 2019/0044055 A1 | 2/2019 | Kondo et al. | |
| 2019/0027031 A1 | 9/2019 | Toshiaki et al. | |
| 2020/0298570 A1 | 9/2020 | Masuda et al. | |

FOREIGN PATENT DOCUMENTS

| | | |
|---|---|---|
| JP | 10-050960 | 2/1998 |
| JP | 11-087791 | 3/1999 |
| JP | 11-188867 | 7/1999 |
| JP | 11-191645 | 7/1999 |

(Continued)

*Primary Examiner* — Erica S Lin
(74) *Attorney, Agent, or Firm* — Xsensus LLP (57) ABSTRACT

An actuator includes a substrate, a diaphragm on the substrate, a lower electrode on the diaphragm, a piezoelectric body on the lower electrode, and an upper electrode on the piezoelectric body. A ratio of lead (Pb) and zirconium (Zr) in atomic percent (atm %) present at a grain boundary in the piezoelectric body satisfies a relation of Pb/Zr>1.7.

6 Claims, 6 Drawing Sheets

(56) References Cited

FOREIGN PATENT DOCUMENTS

| | | |
|---|---|---|
| JP | 2001-199798 | 7/2001 |
| JP | 2005-244174 | 9/2005 |
| JP | 2005-272294 | 10/2005 |
| JP | 2007-335779 | 12/2007 |
| JP | 2008-218864 | 9/2008 |
| JP | 2013-080886 | 5/2013 |
| JP | 2015-053504 | 3/2015 |

\* cited by examiner

ACTUATOR, LIQUID DISCHARGE HEAD, LIQUID DISCHARGE APPARATUS, AND METHOD OF MANUFACTURING ACTUATOR

CROSS-REFERENCE TO RELATED APPLICATION

This patent application is based on and claims priority pursuant to 35 U.S.C. § 119(a) to Japanese Patent Application No. 2020-024267, filed on Feb. 17, 2020, in the Japan Patent Office, the entire disclosure of which is hereby incorporated by reference herein.

BACKGROUND

Technical Field

Embodiments of the present disclosure relate to an actuator, a liquid discharge head, a liquid discharge apparatus, and a method of manufacturing the actuator.

Related Art

As a liquid discharge apparatus, there is known, for example, an inkjet recording apparatus including a liquid discharge head that discharges liquid such as ink. For such a liquid discharge head, there are known technologies of using a piezoelectric body as a drive source of an actuator, and technologies of enhancing piezoelectric characteristics are proposed to obtain a high quality image or the like.

SUMMARY

In an aspect of the present disclosure, there is provided an actuator that includes a substrate, a diaphragm on the substrate, a lower electrode on the diaphragm, a piezoelectric body on the lower electrode, and an upper electrode on the piezoelectric body. A ratio of lead (Pb) and zirconium (Zr) in atomic percent (atm %) present at a grain boundary in the piezoelectric body satisfies a relation of Pb/Zr>1.7.

In another aspect of the present disclosure, there is provided a method of making an actuator that includes a substrate, a diaphragm on the substrate, a lower electrode on the diaphragm, a piezoelectric body on the lower electrode, and an upper electrode on the piezoelectric body. The method includes forming the piezoelectric body with a precursor material in which an excess amount of lead (Pb) with respect to zirconium (Zr) and titanium (Ti) is 4.0% or more when a stoichiometric ratio of Pb/(Zr+Ti) being 1 represents 100%.

BRIEF DESCRIPTION OF THE DRAWINGS

A more complete appreciation of the disclosure and many of the attendant advantages and features thereof can be readily obtained and understood from the following detailed description with reference to the accompanying drawings, wherein.

The accompanying drawings are intended to depict embodiments of the present disclosure and should not be interpreted to limit the scope thereof. The accompanying drawings are not to be considered as drawn to scale unless explicitly noted.

DETAILED DESCRIPTION

The terminology used herein is for the purpose of describing particular embodiments only and is not intended to be limiting of the present disclosure. As used herein, the singular forms "a", "an" and "the" are intended to include the plural forms as well, unless the context clearly indicates otherwise.

In describing embodiments illustrated in the drawings, specific terminology is employed for the sake of clarity. However, the disclosure of this specification is not intended to be limited to the specific terminology so selected and it is to be understood that each specific element includes all technical equivalents that have a similar function, operate in a similar manner, and achieve a similar result.

With reference to drawings, descriptions are given below of embodiments of the present disclosure. It is to be noted that elements (for example, mechanical parts and components) having the same functions and shapes are denoted by the same reference numerals throughout the specification and redundant descriptions are omitted.

Hereinafter, an actuator, a liquid discharge head, a liquid discharge apparatus, and a method of manufacturing the actuator according to embodiments the present are described with reference to the drawings. Embodiments of the present disclosure are not limited to embodiments hereinafter described, and changes such as other embodiments, additions, modifications, and deletions may be made within the scope conceivable by those skilled in the art. Any aspects are included in the scope of the present disclosure as long as the actions and effects of the present disclosure are exhibited.

An actuator according to the present embodiment includes a substrate, a diaphragm disposed on the substrate, a lower electrode disposed on the diaphragm, a piezoelectric body disposed on the lower electrode, and an upper electrode disposed on the piezoelectric body. A ratio of lead (Pb) [atm %] and zirconium (Zr) [atm %] present at a grain boundary in the piezoelectric body satisfies a relation of Pb/Zr>1.7.

Figure 1:
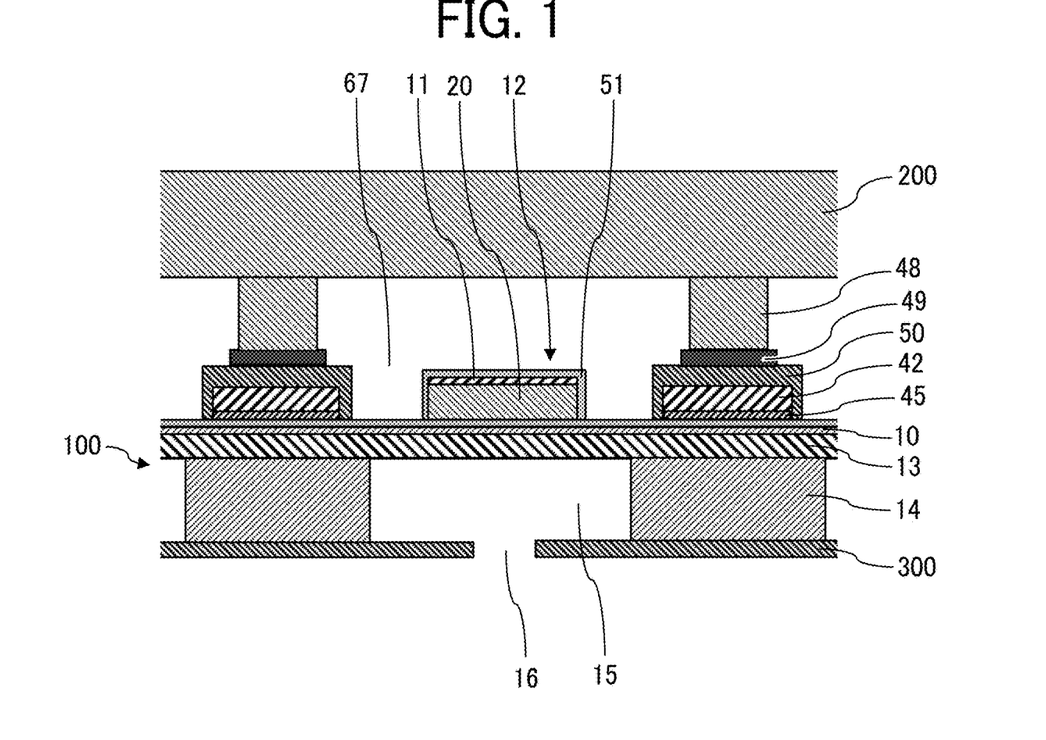
FIG. 1 is a schematic cross-sectional view illustrating a liquid discharge head according to an embodiment of the present disclosure, taken along a short side of a liquid chamber.
Figure 2:
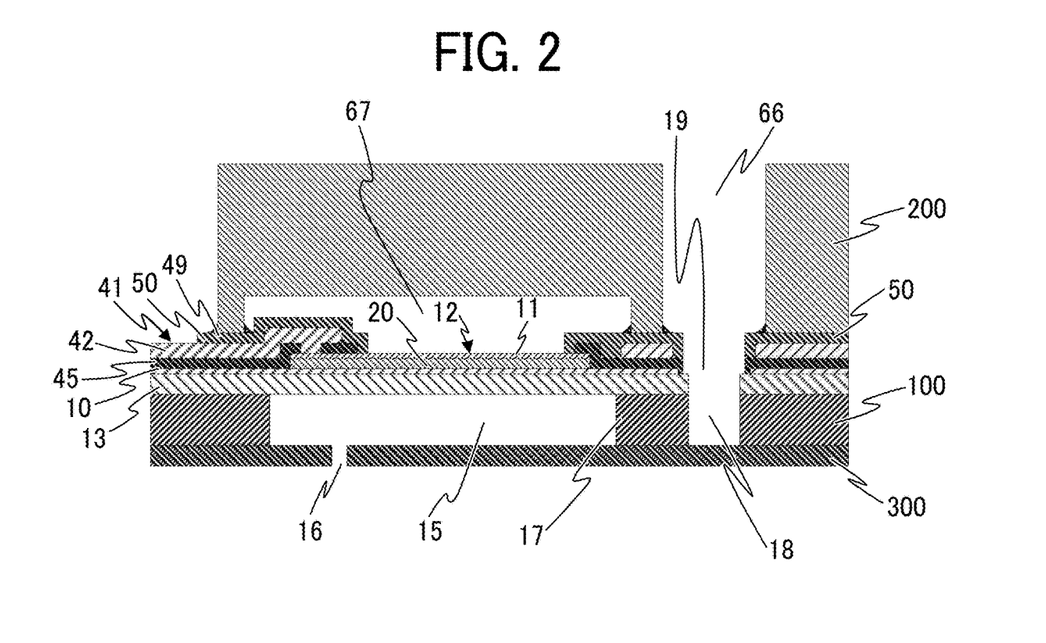
FIG. 2 is a schematic cross-sectional view illustrating a liquid discharge head according to an embodiment of the present disclosure, taken along a long side of a liquid chamber.

FIG. 1 is a cross-sectional view of a liquid discharge head including an actuator (also referred to as a piezoelectric actuator or a piezoelectric element) according to the present embodiment in a short direction of a liquid chamber. FIG. 2 is a cross-sectional view of the liquid discharge head of FIG. 1 in a long direction of the liquid chamber. As illustrated in FIGS. 1 and 2, a liquid discharge head 150 according to the present embodiment includes actuators 12 to generate liquid discharge energy and a diaphragm 13 on an actuator substrate 100. The liquid discharge head 150 further includes pressurizing-liquid-chamber partitions 14 and pressurizing liquid chambers 15. Each pressurizing liquid chamber 15 is partitioned by the pressurizing-liquid-chamber partitions 14.

A piezoelectric body 20 is made of lead zirconate titanate (PZT) and is sandwiched between a common electrode 10 and an individual electrode 11. A voltage is applied to the piezoelectric body 20 via a wiring layer 42 (also referred to as wiring, lead wiring, or the like) stacked on each electrode layer.

The actuator substrate 100 and a nozzle substrate 300 constitute the pressurizing liquid chambers 15. The actuator substrate 100, a support substrate 200, and the nozzle substrate 300 are bonded to each other to form the liquid discharge head 150.

In the liquid discharge head 150 having such a configuration, a controller applies a pulse voltage in a state in which each pressurizing liquid chamber 15 is filled with liquid, for example, recording liquid (ink). The controller causes an oscillation circuit to apply a pulse voltage of, e.g., 20 V to the individual electrode 11 corresponding to a nozzle orifice 16 from which the recording liquid is to be discharged, via a connection hole formed in the wiring layer and an interlayer insulating film.

When the pulse voltage is applied, the piezoelectric body 20 itself contracts in a direction parallel to the diaphragm 3 due to the electrostrictive effect, and the diaphragm 3 bends toward the pressurizing liquid chamber 5. As a result, the pressure in the pressurizing liquid chamber 15 rapidly increases, and the recording liquid is discharged from the nozzle orifice 16 communicating with the pressurizing liquid chamber 15.

After the application of the pulse voltage, the contracted piezoelectric body 20 returns to its original position, so that the bent diaphragm 13 returns to its original position. As a result, the pressure in the pressurizing liquid chamber 15 becomes negative as compared with the pressure in a common liquid chamber 18. The recording liquid (e.g., ink) supplied from the outside via a liquid supply port 66 is supplied from a common liquid supply passage 19 and the common liquid chamber 18 to the pressurizing liquid chamber 15 via a fluid restrictor 17. Repeating such operation allows liquid droplets to be continuously discharged. Thus, an image is formed on a recording medium (e.g., a sheet of paper) placed to face the liquid discharge head 150.

Next, the actuator according to the present embodiment is further described. In the related art, for example, there is a need for enhancing the insulation resistance of an actuator. One example of an indicator of insulation resistance in an actuator is that the dielectric breakdown voltage of a piezoelectric body is equal to or higher than 70 V.

As a result of diligent studies, the present inventor has found that there is a correlation between the amount of Pb present at grain boundaries in the piezoelectric material and the insulation resistance. It is considered that the generation of holes due to Pb deficiency and the excessive Pb itself serve as a leakage source and affect the insulation resistance. Then, the present inventor focused on the ratio (Pb/Zr) of Pb and Zr present at grain boundaries in the piezoelectric body. When the present inventor made experiments with various values of Pb/Zr, the present inventor has found that good insulation resistance is obtained when Pb/Zr>1.7. According to embodiments of the present disclosure, an actuator having good insulation resistance and high reliability can be provided by controlling the ratio of Pb and Zr present at grain boundaries in the piezoelectric body.

Hereinafter, the ratio of Pb and Zr present at grain boundaries in the piezoelectric body may be referred to as "Pb/Zr at grain boundaries".

The ratio of Pb and Zr present at grain boundaries in the piezoelectric material is determined by the atomic % of Pb and the atomic % of Zr. The ratio of Pb/Zr is a dimensionless value. Note that the expression "Pb/Zr [%]" represents a value obtained by multiplying the value of Pb/Zr by 100.

The ratio of Pb/Zr at grain boundaries is measured by energy dispersive X-ray analysis (EDX). A scanning transmission electron microscope (STEM) is used as a measuring apparatus, and the surface of a piezoelectric body is observed from the thickness direction (or film thickness direction) and the horizontal direction to confirm grain boundaries. Thereafter, composition information is obtained by point analysis between grains using EDX. The ratio of Pb/Zr at grain boundaries is preferably determined by averaging the measured values at about three points, for example.

When the ratio of Pb and Zr present at grain boundaries in the piezoelectric body, a side surface of a crystal grain (also referred to as grain) in the piezoelectric body is measured. In the present embodiment, even when the measured surface of the crystal grain in the piezoelectric body is not strictly the side surface, a region within 5 nm from the side surface of the crystal grain is treated as a grain boundary.

Figure 3:
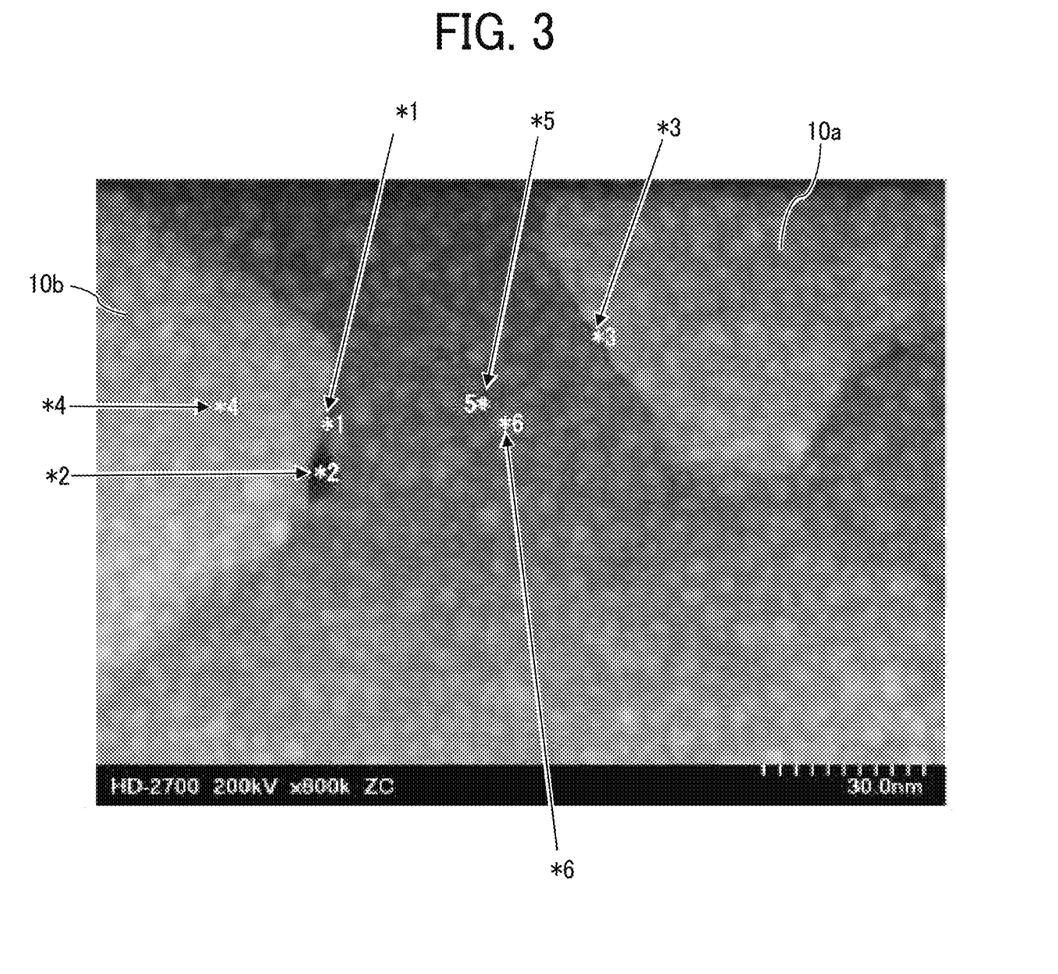
FIG. 3 is an example of a scanning electron microscope (SEM) image of a piezoelectric body.

FIG. 3 is a diagram illustrating an example of measurement points. FIG. 3 presents an example of a STEM image of a piezoelectric body viewed from a direction perpendicular to the film thickness direction of the piezoelectric body. Here, a cross section parallel to the surface direction of the layer is formed on the outermost surface of the piezoelectric body, and a STEM image is acquired.

FIG. 3 illustrates a crystal grain 10a and a crystal grain 10b and grain boundaries of the crystal grain 10a and the crystal grain 10b. In FIG. 3, *1 to *6 indicate measurement points of Pb/Zr. For example, *1 to *3 indicate measurement points of grain boundaries, and *4 to *6 indicate measurement points inside crystal grains. In the example illustrated in FIG. 3, side surfaces of a crystal grain are measured at the measurement points *1 and *3. On the other hand, the measurement point *2 is away from a side surface of the crystal grain by about 3 nm. As described above, a point away from a side surface of a crystal grain is also considered as a grain boundary if the distance from the point to the side surface is within a predetermined value.

The amount of Pb in the piezoelectric body can be controlled by, for example, changing the amount of Pb contained in sol-gel liquid used when the piezoelectric body is formed into a film by a sol-gel method. In addition, the ratio of Pb/Zr at grain boundaries in the piezoelectric body can be similarly controlled by changing the amount of Pb contained in the sol-gel liquid.

The amount of Pb in a precursor material such as sol-gel liquid may be appropriately changed. For example, when the stoichiometric ratio of Pb/(Zr+Ti)=1 (100%), the amount of Pb is preferably an excessive amount of 4.0% or more with respect to Zr+Ti. In this case, the ratio of Pb/Zr at grain boundaries is likely to be larger than 1.7.

When the amount of Pb is an excess amount with respect to Zr+Ti, it means that the ratio of Pb/(Zr+Ti) is greater than 100%. The excess amount of 4.0% or more means that the ratio of Pb/(Zr+Ti) is 104% or more.

The amount of Pb being excessive with respect to Zr+Ti is referred to as Pb excess amount. The Pb excess amount is calculated using the molar values of Pb, Zr, and Ti in the precursor material.

As for the amount of Pb in the precursor material, when the stoichiometric ratio Pb/(Zr+Ti)=1 (100%), the amount of Pb is preferably an excess amount of 4.0% or more and 18.0% or less with respect to (Zr+Ti). When the Pb excess amount is 18.0% or less, the occurrence of leakage can be restrained, and good insulation resistance can be obtained.

Figure 4:
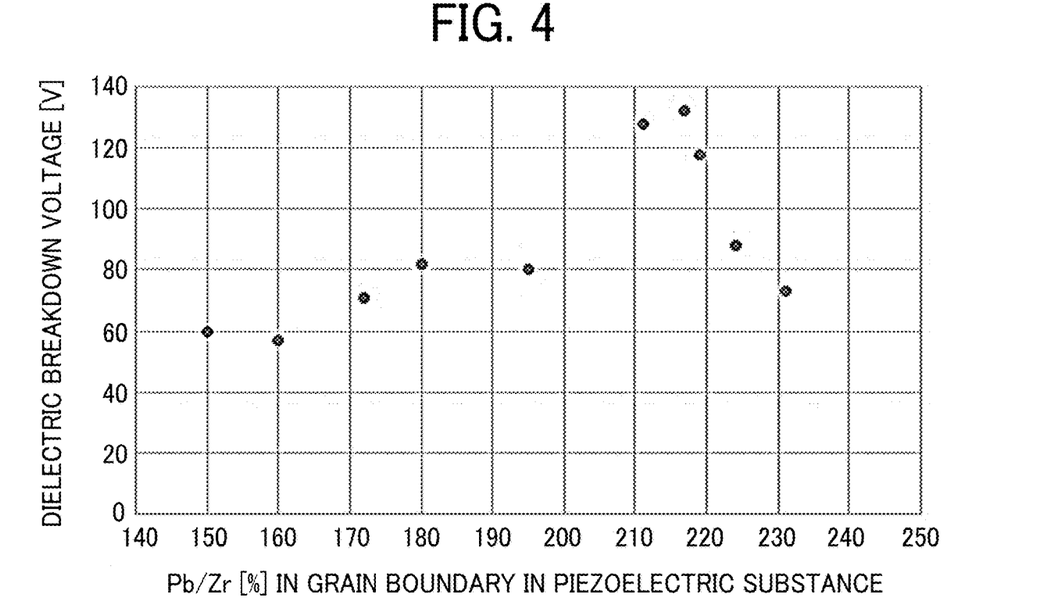
FIG. 4 is a graph of an example of the relation between the ratio of Pb/Zr [%] at grain boundaries in a piezoelectric body and the dielectric breakdown voltage [V]
Figure 5:
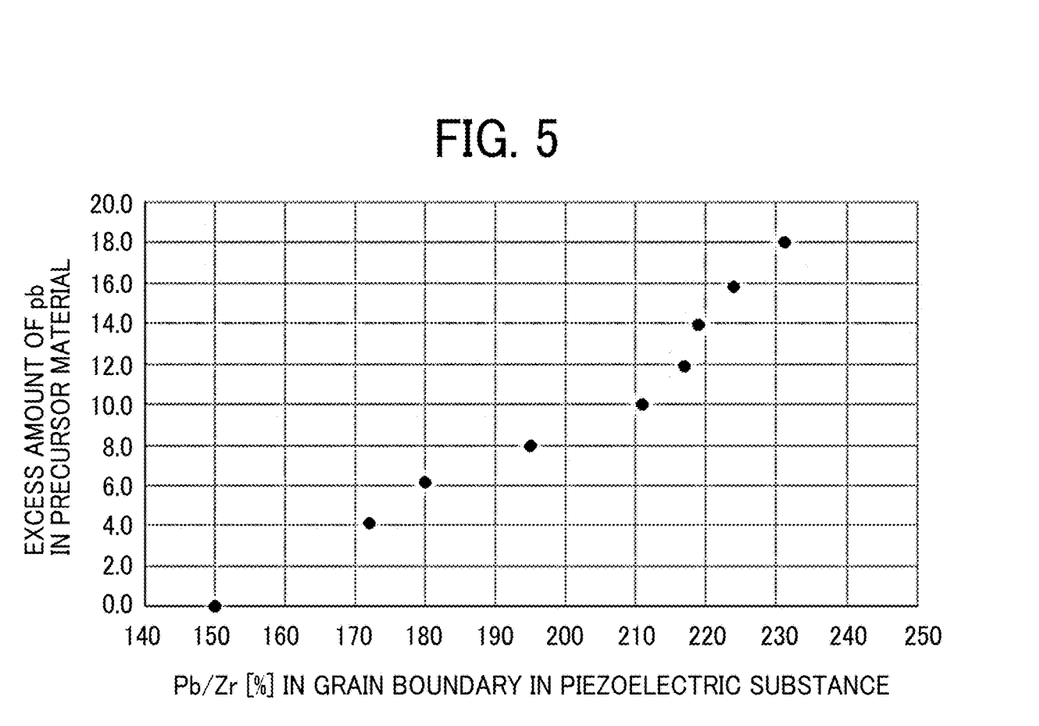
FIG. 5 is a graph of an example of the relation between the ratio of Pb/Zr [%] at grain boundaries in a piezoelectric body and the Pb excess amount [%] in a precursor material.

FIG. 4 illustrates an example of the relation between the ratio of Pb/Zr [%] at grain boundaries in the piezoelectric body and the dielectric breakdown voltage [V]. FIG. 5 illustrates an example of the relation between the ratio of Pb/Zr [%] at grain boundaries in the piezoelectric body and the Pb excess amount [%] in the precursor material.

As illustrated in FIG. 4, when Pb/Zr [%] at grain boundaries is larger than 170, in other words, when Pb/Zr is larger than 1.7, the dielectric breakdown voltage can be set to be larger than 70V, and good dielectric strength can be obtained. The dielectric strength increases as the value of Pb/Zr increases. However, when the value exceeds a certain value, the dielectric strength decreases.

On the other hand, as illustrated in FIG. 5, Pb/Zr at grain boundaries increases depending on the excess amount of Pb in the precursor material. Considering FIGS. 4 and 5 together, it is preferable that the excess amount of Pb in the precursor material is not less than 4.0% and not more than 18.0% from the relation between the upper limit value of Pb/Zr at which good insulation resistance is obtained and the excess amount of Pb in the precursor material.

In the present embodiment, the dielectric breakdown voltage is a voltage at which dielectric breakdown occurs in the piezoelectric body when the applied voltage is increased stepwise.

As a method of controlling Pb/Zr at the grain boundaries in the piezoelectric body, for example, a method of controlling the firing temperature at the time of forming the piezoelectric body may be exemplified in addition to the above-described method. As the firing temperature increases, the amount of Pb decreases and Pb/Zr decreases. The firing temperature can be appropriately changed, but is preferably 650° C. to 750° C., for example.

Figure 6:
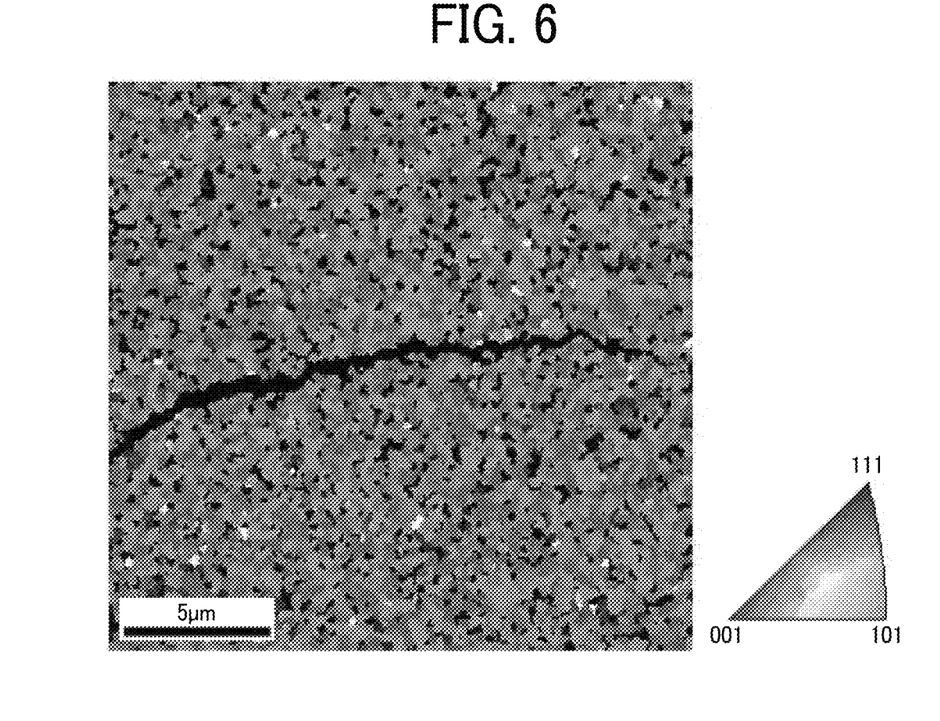
FIG. 6 is a diagram illustrating an example of a method of measuring the particle diameter of a piezoelectric body.

In the piezoelectric body, an average equivalent circle diameter of crystal grains is preferably equal to or larger than 40 nm. In such a case, good insulation resistance is obtained. The average equivalent circle diameter of crystal grains can be calculated from the grain size distribution of each crystal grain by mapping the surface of the piezoelectric body by an electron backscatter diffraction (EBSD) method. FIG. 6 is a diagram illustrating an example of a case in which the surface of the piezoelectric body is mapped by the EBSD method. Since the crystal grains of the piezoelectric body can be divided for each orientation, the size of each crystal grain can be accurately acquired.

Figure 7:
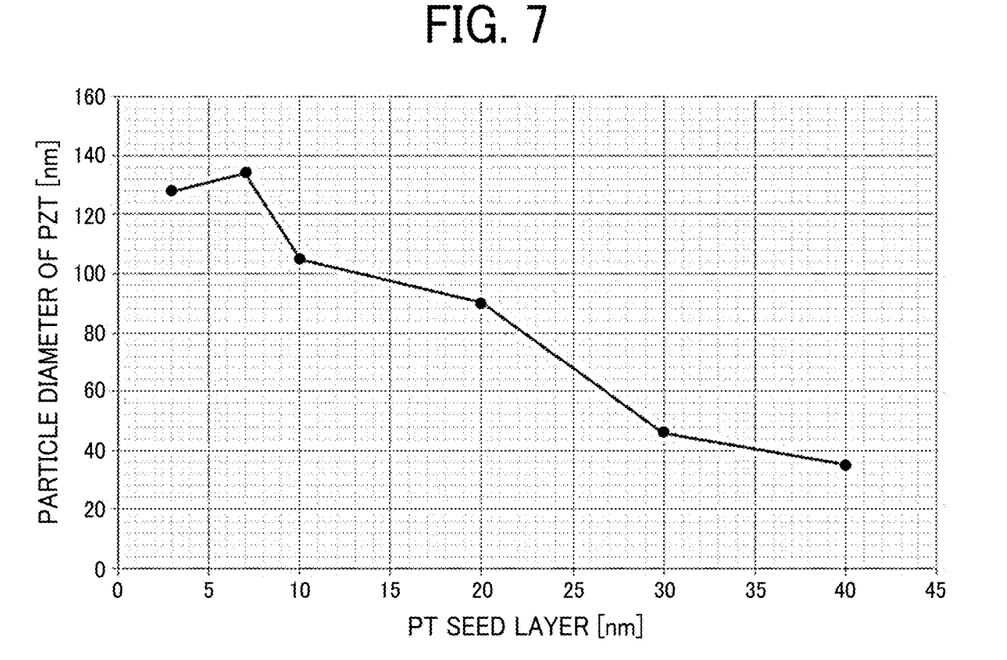
FIG. 7 is a graph of an example of the relation between PT seed film thickness [nm] and PZT particle diameter [nm]

The size of crystal grains in the piezoelectric body is described with reference to FIGS. 7 and 8. FIG. 7 is a diagram illustrating an example of the relation between the PT seed film thickness [nm] on the horizontal axis and the PZT particle diameter [nm] on the vertical axis. The PZT particle diameter "refers to the average equivalent circle diameter of crystal grains in the piezoelectric body. The PT seed corresponds to a crystal control layer formed on the lower electrode and directly below the piezoelectric body. $PbTiO_3$, for example, can be used as the Pt seed layer.

Figure 8:
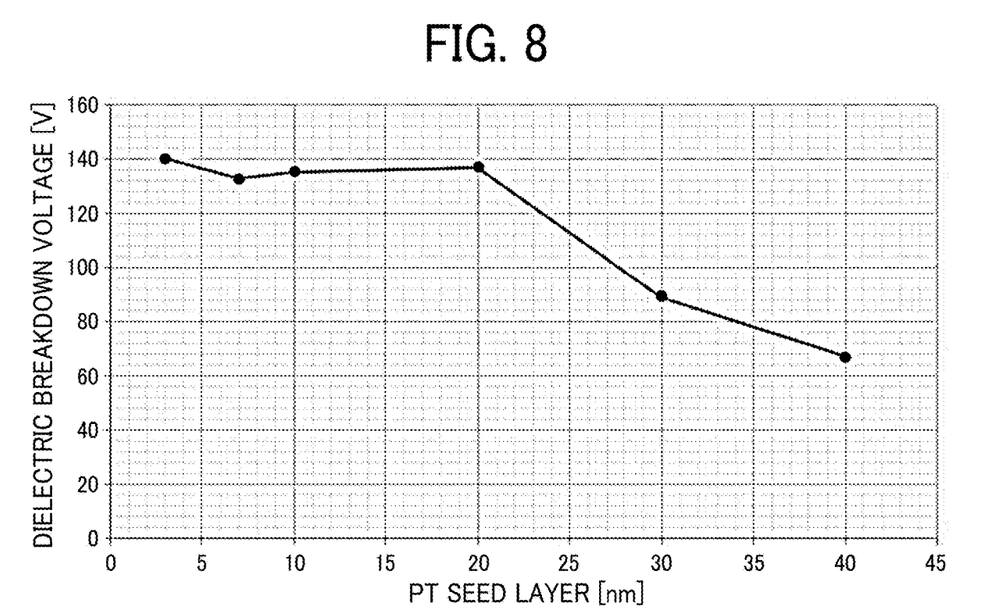
FIG. 8 is a graph of an example of the relation between PT seed film thickness [nm] and dielectric breakdown voltage [V]

FIG. 8 is a diagram illustrating an example of the relationship between the PT seed film thickness [nm] on the horizontal axis and the dielectric breakdown voltage [V] on the vertical axis. As illustrated in FIG. 8, as the thickness of the Pt seed film increases, the dielectric breakdown voltage decreases, and the dielectric breakdown voltage falls below 70V near the thickness of 35 nm.

At this time, referring to FIG. 7, the PZT particle diameter is about 40 nm in the vicinity of the PT seed film thickness of 35 nm. Therefore, when the average equivalent circle diameter of ¥crystal grains in the piezoelectric body is equal to or larger than 40 nm, good insulation resistance can be obtained. Although not particularly limited, the average equivalent circle diameter of crystal grains in the piezoelectric body is preferably 140 nm or less.

The liquid discharge head according to the present embodiment includes nozzles to discharge liquid, liquid chambers communicated with the nozzles, and actuators to pressurize the liquid in the liquid chambers. Each of the actuators is an actuator according to the present embodiment.

An example of a method of manufacturing the liquid discharge head according to the present embodiment is described. Here, an example of manufacturing the liquid discharge head illustrated in FIGS. 1 and 2 is described.

(a) As the actuator substrate 100, the diaphragm 13 is formed as a film on a silicon single crystal substrate (of a thickness of, for example, 400 μm) having a plane orientation (110). The diaphragm 13 may have a structure in which three layers of a silicon oxide film, a silicon nitride film, and an amorphous layer are laminated by, for example, a low-pressure chemical vapor deposition (LP-CVD) method.

The silicon oxide film preferably has compressive stress, and the silicon nitride film preferably has tensile stress. Each film thickness can be appropriately changed, and is determined so that the stress has a desired value, for example.

As the amorphous layer, for example, a silicon oxide film or alumina is preferably used, but the amorphous layer is not limited to the silicon oxide film or alumina. As the amorphous layer, it is preferable to select an appropriate material so as to trap Pb contained in PZT formed on the amorphous layer. In order to reliably prevent diffusion of Pb from PZT, the film thickness of the amorphous layer is preferably equal to or larger than 40 nm.

Thereafter, for example, the common electrode 10 containing $TiO_2$ and Pt is formed into films of 20 nm and 160 nm, respectively, by sputtering. In this example, the common electrode 10 corresponds to a lower electrode.

(b) Next, a precursor material is applied onto the common electrode 10 by, for example, spin coating in a plurality of times, and PZT is formed as the piezoelectric body 20 so as to have a final thickness of 2 μm.

Here, a method of forming a film by a sol-gel method is illustrated as an example. First, as a seed layer for controlling the orientation of PZT, a $PbTiO_3$ film is formed at approximately 7 nm by spin coating. The precursor material is then applied by, for example, spin coating to form a PZT precursor.

Next, the PZT precursor is heated. The temperatures relating to the heating may be appropriately changed. For example, the drying temperature may be 120° C., the pre-firing temperature may be 380° C., and the main firing temperature may be 700° C.

Next, the piezoelectric body 20 and the individual electrode 11 are formed at a position corresponding to the pressurizing liquid chamber 15 to be formed later by lithography etching. The piezoelectric body 20 and the individual electrode 11 are formed in consideration of the position of the bonding portion 48. As the individual electrode 11, for example, strontium ruthenium oxide (SRO) and platinum (Pt) can be used. For example, an SRO film of 40 nm and a PT film of 100 nm are formed by sputtering. In this example, the individual electrode 11 corresponds to an upper electrode.

(c) Next, an interlayer insulating film 45 is formed to insulate the common electrode 10 and the piezoelectric body 20 from a wiring layer 42 to be formed later. As the interlayer insulating film 45, a $SiO_2$ film of 1000 nm is formed by, for example, a plasma CVD method. The interlayer insulating film 45 may be any other film than the $SiO_2$ film formed by the plasma CVD method as long as the film does not affect the piezoelectric body 20 and the electrode materials and has insulating properties.

Next, a connection hole that connects the individual electrode 11 and the wiring layer 42 is formed by a lithography etching method. When the common electrode 10 is also connected to the wiring layer 42, a connection hole is similarly formed.

(d) Next, as the wiring layer 42, for example, TiN and Al, respectively, are formed into a film having a thickness of 30 nm and a film having a thickness of 3 μm by sputtering. TiN can be used as a barrier layer for preventing Pt from being alloyed when TiN is used as the material of the individual electrode 11 or the common electrode 10 at the bottom of the connection hole. In the case in which Pt is used as the material of the individual electrode 11 or the common electrode 10, when Pt is in direct contact with Al that is the material of the wiring layer 42, Pt may be alloyed by heat history in a subsequent step. In this case, film peeling or the like may occur due to stress caused by volume change. However, use of TiN can prevent the film peeling or the like.

Next, the wiring layer 42 is also formed on a portion that is to be the bonding portion 48 with the support substrate 200 later.

(e) Next, as a passivation film 50, a silicon nitride film is formed with a thickness of 1000 nm by, for example, a plasma CVD method.

(f) Next, portions of the wiring layer 42 corresponding to a lead wiring pad portion 41 and the piezoelectric body 20 and an opening of the common liquid supply passage 19 are formed by lithography etching.

(g) Next, the common liquid supply passage 19 and a portion of the diaphragm 13 to be the common liquid chamber 18 later are removed by lithography etching.

(h) Next, a counterbore 67 is provided at a position corresponding to the piezoelectric body 20 by lithography etching, to produce the support substrate 200 in which the bonding portion 48 is formed. At this time, Si processing is performed by dry etching or the like.

Next, the support substrate 200 and the actuator substrate 100 are bonded by adhesive 49 via the bonding portion 48. The adhesive 49 is applied to a thickness of about 1 μm on the support substrate 200 side by, e.g., a general thin-film transfer apparatus.

Next, in order to form the pressurizing liquid chamber 15, the common liquid chamber 18, and the fluid restrictor 17, the actuator substrate 100 is polished so as to have a desired thickness t (for example, a thickness of 80 μm). Instead of the polishing method, etching or the like may be used.

(I) Next, partition portions other than the pressurizing liquid chamber 15, the common liquid chamber 18, and the fluid restrictor 17 are coated with a resist by a lithography method. Next, anisotropic wet etching is performed using an alkali solution (for example, a potassium hydroxide (KOH) solution or a tetramethylammonium hydroxide (TMHA) solution) to form the pressurizing liquid chamber 15, the common liquid chamber 18, and the fluid restrictor 17. The pressurizing liquid chamber 15, the common liquid chamber 18, and the fluid restrictor 17 may be formed by dry etching using an inductively coupled plasma (ICP) etcher instead of anisotropic etching using an alkali solution.

(j) Next, the nozzle substrate 300, in which the nozzle orifices 16 are opened positions corresponding to the pressurizing liquid chambers 15 separately formed, are bonded to form a liquid discharge head.

Next, a liquid discharge apparatus according to the present embodiment is described. A liquid discharge apparatus according to the present embodiment includes a liquid container to contain liquid, the liquid discharge head according to the present embodiment to discharge the liquid, a carriage on which the liquid discharge head is mounted, and a main scanning movement mechanism to move the carriage in a main scanning direction.

Figure 9:
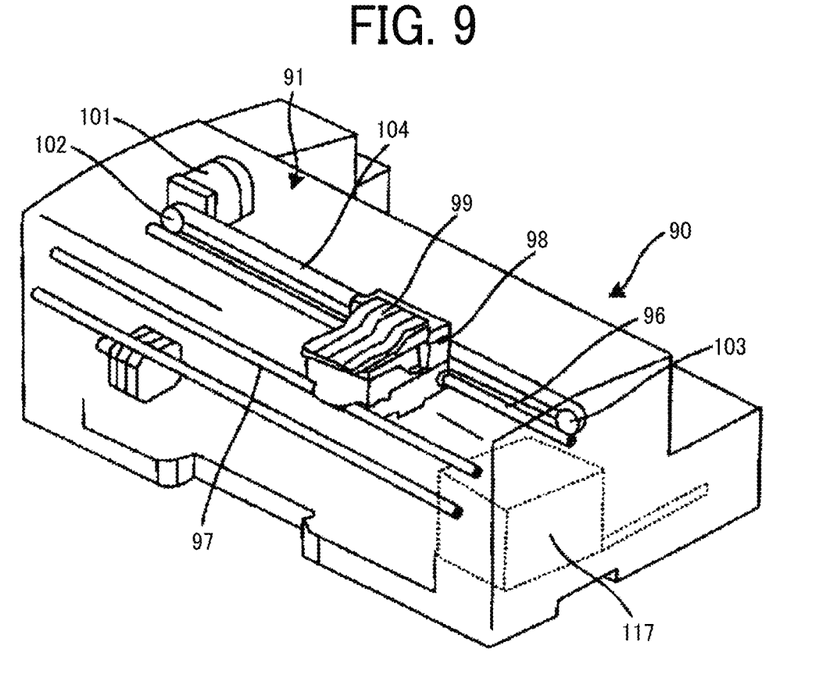
FIG. 9 is a schematic perspective view of a liquid discharge apparatus according to an embodiment of the present disclosure.
Figure 10:
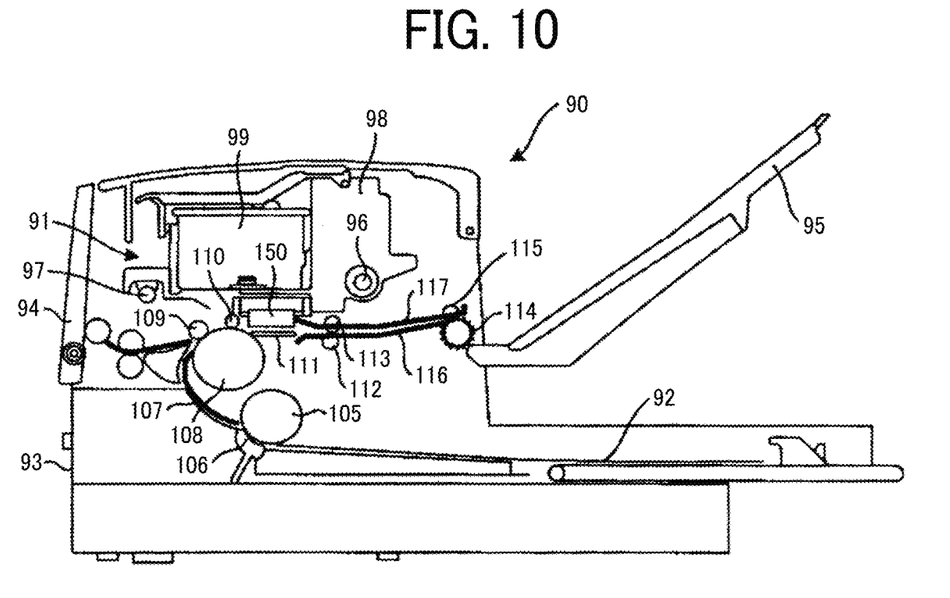
FIG. 10 is a schematic side view of a liquid discharge apparatus according to an embodiment of the present disclosure.

FIGS. 9 and 10 illustrate the liquid discharge apparatus according to the present embodiment. In the present example, an inkjet recording apparatus is described as an example of the liquid discharge apparatus.

The inkjet recording apparatus 90 houses a printing mechanism unit 91. The printing mechanism unit 91 includes a carriage 98 movable in a scanning direction, liquid discharge heads 150 mounted on the carriage 98, an ink cartridge 99 to supply ink to the liquid discharge heads 150, and the like inside an apparatus body. A sheet feeding cassette (or a sheet tray) 93 to stack a large number of sheets 92 is attached to a lower portion of the apparatus body in such a manner that the sheet feeding cassette 93 can be inserted into and removed from the front side of the apparatus body.

The inkjet recording apparatus 90 includes a bypass tray (or manual feed tray) 94 that is opened to manually feed the sheet 92. The inkjet recording apparatus 90 takes in the sheet 92 fed from the sheet feeding cassette 93 or the bypass tray 94, records a desired image on the sheet 92 by the printing mechanism unit 91, and ejects the sheet 92 to an ejection tray 95 mounted on the rear side of the apparatus body.

In the printing mechanism unit 91, a main guide rod 96 and a sub-guide rod 97 serving as guides laterally bridged between a left side plate and a right side plate support the carriage 98 slidably in the main scanning direction. The liquid discharge heads 150 to discharge ink droplets of different colors of yellow (Y), cyan (C), magenta (M), and black (Bk) are mounted on the carriage 98 so that a plurality of ink discharge ports (nozzles) of each nozzle row is arranged in a direction crossing the main scanning direction. The liquid discharge heads 150 are mounted on the carriage 98 in such a direction that ink droplets are discharged downward. The ink cartridges 99 to supply the respective color inks to the liquid discharge heads 150 are mounted on the carriage 98 in a replaceable manner.

The ink cartridge 99 has an air port communicated with the ambient atmosphere at the upper side of the ink cartridge 99 and has a supply port to supply ink to the corresponding liquid discharge head 150 at the lower side of the ink cartridge 99. The ink cartridge 99 includes a porous body filled with ink, and the ink supplied to the liquid discharge head 150 is maintained at a slight negative pressure by the capillary force of the porous body.

In the present embodiment, the liquid discharge heads 150 discharge ink of respective colors. Note that, in some embodiments, a single liquid discharge head may be used that includes nozzles to discharge ink of different colors.

In the present embodiment, the rear side (the downstream side in a sheet conveyance direction) of the carriage 98 is slidably fitted to the main guide rod 96, and the front side (the upstream side in the sheet conveyance direction) of the carriage 98 is slidably mounted to the sub-guide rod 97. In order to move and scan the carriage 98 in the main scanning direction, a timing belt 104 is stretched between a driving pulley 102 rotationally driven by a main scanning motor 101 and a driven pulley 103. The timing belt 104 is secured to the carriage 98, and the carriage 98 is reciprocated by forward rotation and reverse rotation of the main scanning motor 101.

A sheet feeding roller 105 and a friction pad 106 that separate and feed the sheet 92 from the sheet feeding cassette 93 are provided to convey the sheet 92 set in the sheet feeding cassette 93 to the lower side of the liquid discharge head 150. The inkjet recording apparatus 90 further includes a guide member 107 to guide the sheet 92, a conveyance roller 108 to reverse and convey the fed sheet 92, a conveyance roller 109 pressed against the circumferential surface of the conveyance roller 108, and a leading end roller 110 to define the feed angle of the sheet 92 from the conveyance roller 108. The conveyance roller 108 is rotationally driven by a sub-scanning motor via a gear train.

The inkjet recording apparatus 90 further includes a print receiver 111 disposed below the liquid discharge heads 150. The print receiver 111 is a sheet guide to guide a sheet 92, which is fed from the conveyance roller 108, in a range corresponding to a range of movement of the carriage 98 in the main scanning direction.

A conveyance roller 112 and a spur roller 113 are disposed on the downstream side of the print receiver 111 in a sheet conveyance direction. The conveyance roller 112 is driven to rotate so as to feed the sheet 92 in a sheet ejecting direction. The inkjet recording apparatus 90 further includes a sheet ejection roller 114 and a spur roller 115 to feed the sheet 92 to the ejection tray 95 and a plurality of guides 116 and 117 constituting a sheet ejection passage.

When the inkjet recording apparatus 90 performs recording, the inkjet recording apparatus 90 drives the liquid discharge heads 150 in accordance with an image signal while moving the carriage 98. As a result, ink is ejected onto the stopped sheet 92 to record one line of an image. Next, after the sheet 92 is fed by a predetermined amount, the next line is recorded.

In response to a recording end signal or a signal indicating that the rear end of the sheet 92 has reached a recording area, the inkjet recording apparatus 90 ends the recording operation and ejects the sheet 92.

The inkjet recording apparatus 90 further includes a recovery device 117 to recover a discharge failure of the liquid discharge heads 150. The recovery device 117 is disposed at a position outside the recording area at the right end in a movement direction of the carriage 98. The recovery device 117 includes a cap unit, a suction unit, and a cleaning unit. In a printing standby state, the carriage 98 is placed at the side at which the recovery device 117 is disposed and the liquid discharge heads 150 are capped with the cap unit. Accordingly, the ink discharge ports are maintained in a wet state, thus preventing occurrence of a discharge failure due to ink dry. For example, during recording, the inkjet recording apparatus 90 discharges ink not relating to the recording to maintain the viscosity of ink in all of the ink discharge ports constant, thus maintaining a stable discharge state.

When a discharge failure occurs, the ink discharge ports (nozzles) of the liquid discharge heads 150 are sealed with the cap unit and ink and bubbles are sucked from the ink discharge ports by the suction unit through a tube. The cleaning unit removes ink and dust adhered to a discharge port face, thus recovering the discharge failure. The sucked ink is drained to a waste ink container at a lower portion of the apparatus body, and is absorbed into and retained in an ink absorber of the waste ink container.

As described above, the inkjet recording apparatus 90 is mounted with the liquid discharge head according to the present embodiment. Thus, stable ink discharge characteristics are obtained, and image quality is enhanced. Note that the example in which a liquid discharge head is used in the inkjet recording apparatus 90 has been described above. In some embodiments, for example, the liquid discharge head may be applied to an apparatus that discharges droplets other than ink, for example, a liquid resist for patterning.

EXAMPLES

Further understanding can be obtained by reference to certain specific examples which are provided herein for the purpose of illustration only and are not intended to be limiting.

Example 1

Making of Liquid Discharge Head

In this example, the liquid discharge head illustrated in FIGS. 1 and 2 is made. (a) On a silicon single crystal substrate (400 μm thick) having a plane orientation (110), three layers of a silicon oxide film, a silicon nitride film, and an amorphous layer (having a film thickness equal to or larger than 40 nm) were by LP-CVD to form the diaphragm 13. Next, the common electrode 10 (lower electrode) made of $TiO_2$ and Pt was formed into a 20 nm film and a 160 nm film, respectively, by sputtering.

(b) Next, on the common electrode 10, as a seed layer for controlling the orientation of PZT, a film of $PbTiO_3$ was formed by spin coating so as to have a thickness of approximately 7 nm. Next, the PZT precursor solution was applied in a plurality of times by spin coating. Drying and firing were performed to form a film of PZT having a final thickness of 2 μm as the piezoelectric body 20. The temperature for drying the PZT precursor formed from the PZT precursor solution was 120° C., the pre-firing temperature was 380° C., and the main firing temperature was 700° C. In the PZT precursor solution, when the stoichiometric ratio Pb/(Zr+Ti)=1 (100%), the amount of Pb was set to an excess amount of 11.9% with respect to (Zr+Ti).

Next, the piezoelectric body 20 and the individual electrode 11 were formed at a position corresponding to the pressurizing liquid chamber 15 to be formed later by lithography etching. The piezoelectric body 20 and the individual electrode 11 were formed in consideration of the position of the bonding portion 48. As the individual electrode 11 (upper electrode), SRO and Pt were formed into a 40 nm film and a 100 nm film, respectively, by sputtering.

(c) Next, a $SiO_2$ film was formed with a thickness of 1000 nm by a plasma CVD method to form the interlayer insulating film 45. Next, a connection hole for connecting the individual electrode 11 and the wiring layer 42 was formed by lithography etching.

(d) Next, as the wiring layer 42, TiN and Al, respectively, were formed into a film having a thickness of 30 nm and a film having a thickness of 3 μm by sputtering. The wiring layer 42 was also formed in a portion that was to be bonded to the support substrate 200 later.

(e) Next, as a passivation film 50, a silicon nitride film was formed with a thickness of 1000 nm by a plasma CVD method.

(f) Next, portions of the wiring layer 42 corresponding to a lead wiring pad portion 41 and the piezoelectric body 20 and an opening of the common liquid supply passage 19 were formed by lithography etching.

(g) Next, the common liquid supply passage 19 and a portion of the diaphragm 13 to be the common liquid chamber 18 later were removed by lithography etching.

(h) Next, a counterbore 67 was provided at a position corresponding to the piezoelectric body 20 by lithography etching, to produce the support substrate 200 in which the bonding portion 48 was formed. At this time, Si processing was performed by dry etching.

Next, the support substrate 200 and the actuator substrate 100 were bonded with the adhesive 49 via the bonding portion 48. The adhesive 49 was applied to a thickness of approximately 1 µm on the support substrate 200 side by a general thin-film transfer apparatus.

Next, in order to form the pressurizing liquid chamber 15, the common liquid chamber 18, and the fluid restrictor 17, the actuator substrate 100 was polished so as to have a thickness of 80 µm.

(I) Next, partition portions other than the pressurizing liquid chamber 15, the common liquid chamber 18, and the fluid restrictor 17 were coated with a resist by lithography. Next, anisotropic wet etching was performed with an alkaline solution to form the pressurizing liquid chamber 15, the common liquid chamber 18, and the fluid restrictor 17.

(j) Next, the nozzle substrate 300, in which the nozzle orifices 16 are opened positions corresponding to the pressurizing liquid chambers 15 separately formed, were bonded to make a liquid discharge head.

Measurements

Next, with respect to the obtained liquid discharge head, the surface of the piezoelectric body was observed from the film thickness direction and the horizontal direction using a STEM as a measurement device, and grain boundaries were confirmed. Thereafter, the composition ratio in the piezoelectric body was determined by point analysis between grains using EDX. In Example 1, the SEM image illustrated in FIG. 3 was obtained, and the composition ratio was determined at each of the measurement points *1 to *6. The results are presented in Table 1. As illustrated in Table 1, the average value of Pb/Zr at the grain boundaries was 2.17.

Next, with respect to the obtained liquid discharge head, a voltage at which dielectric breakdown occurred in the piezoelectric body when the applied voltage was increased stepwise was measured. Thus, a dielectric breakdown voltage [V] were obtained. The result is presented in Table 2. As illustrated in Table 2, the breakdown voltage of Example 1 was 132V.

Examples 2 to 8 and Comparative Examples 1 and 2

A liquid discharge head was obtained in the same manner as in Example 1 except that the excess amount [%] of Pb relative to (Zr+Ti) contained in the PZT precursor solution was changed as presented in Table 2. In addition, the Pb/Zr ratio and the dielectric breakdown voltage [V] at the grain boundaries in the piezoelectric body were determined in the same manner as in Example 1.

The composition ratio in the piezoelectric body in Example 1 is presented in Table 1 below. Table 2 presents the excess amount [%] of Pb in the PZT precursor solution, Pb/Zr at the grain boundaries in the piezoelectric body, and the dielectric breakdown voltage [V] in each of Examples 2 to 8 and Comparative Examples 1 and 2. In Table 2, Pb/Zr at the grain boundaries in the piezoelectric body is represented by Pb/Zr [%].

TABLE 1

| Element | Grain boundary | | | Inside crystal grain | | |
|---|---|---|---|---|---|---|
| O [atm %] | 58.4 | 58.8 | 55.0 | 52.2 | 57.3 | 53.1 |
| Ti [atm %] | 8.8 | 9.6 | 9.4 | 10.2 | 9.4 | 8.5 |
| Zr [atm %] | 10.5 | 10.8 | 10.3 | 10.6 | 10.9 | 9.8 |
| Pb [atm %] | 22.4 | 20.8 | 25.3 | 26.9 | 22.4 | 28.6 |
| Pb/Zr | 2.13 | 1.93 | 2.46 | 2.54 | 2.06 | 2.92 |
| Pb/Zr (Average) | | 2.17 | | | 2.51 | |

TABLE 2

| | Excess amount [%] of Pb with respect to Zr + Ti in precursor material | Pb/Zr [%] in grain boundary in piezoelectric body after film formation | Dielectric breakdown voltage [V] |
|---|---|---|---|
| Example 1 | 11.9 | 217 | 132 |
| Example 2 | 18.0 | 231 | 73 |
| Example 3 | 15.8 | 224 | 88 |
| Example 4 | 13.9 | 219 | 118 |
| Example 5 | 10.0 | 211 | 128 |
| Example 6 | 8.0 | 195 | 80 |
| Example 7 | 6.2 | 180 | 82 |
| Example 8 | 4.1 | 172 | 71 |
| Comparative Example 1 | 2.4 | 160 | 57 |
| Comparative Example 2 | 0 | 150 | 60 |

The invention claimed is:

1. An actuator comprising:
a substrate;
a diaphragm on the substrate;
a lower electrode on the diaphragm;
a piezoelectric body on the lower electrode; and
an upper electrode on the piezoelectric body,
wherein a ratio of lead (Pb) and zirconium (Zr) in atomic percent (atm %) present at a grain boundary in the piezoelectric body satisfies a relation of Pb/Zr>1.7, an average equivalent circle diameter of crystal grains in the piezoelectric body is equal to or larger than 40 nanometers, and
the ratio of lead (Pb) and zirconium (Zr) in atomic percent (atm %) present at the grain boundary is smaller than that inside a grain in the piezoelectric body.

2. The actuator according to claim 1,
wherein a ratio of Pb and Zr in atm % present at the grain boundary in the piezoelectric body satisfies a relation of 2.4>Pb/Zr>1.7.

3. A liquid discharge head comprising:
a nozzle configured to discharge liquid;
a liquid chamber communicated with the nozzle; and
an actuator according to claim 1 configured to pressurize the liquid in the liquid chamber.

4. A liquid discharge apparatus comprising:
a liquid container configured to contain liquid;
the liquid discharge head according to claim 3 configured to discharge the liquid;
a carriage on which the liquid discharge head is mounted; and
a main scanning movement mechanism configured to move the carriage in a main scanning direction.

5. A method of making an actuator that includes a substrate, a diaphragm on the substrate, a lower electrode on the diaphragm, a piezoelectric body on the lower electrode, and an upper electrode on the piezoelectric body, the method comprising forming the piezoelectric body with a precursor material in which an excess amount of lead (Pb) with respect to zirconium (Zr) and titanium (Ti) is 4.0% or more when a stoichiometric ratio of Pb/(Zr+Ti) being 1 represents 100%, wherein an average equivalent circle diameter of crystal grains in the piezoelectric body is equal to or larger than 40 nanometers, and a ratio of lead (Pb) and zirconium (Zr) in atomic percent (atm %) present at a grain boundary is smaller than that inside a grain in the piezoelectric body.

6. The method according to claim 5, wherein, in the precursor material, an excess amount of Pb with respect to Zr and Ti is 4.0% or more and 18.0% or less.

* * * * *